United States Patent [19]
Cho et al.

[11] Patent Number: 5,668,022
[45] Date of Patent: Sep. 16, 1997

[54] SILICON-SILICON-GERMANIUM HETEROJUNCTION BIPOLAR TRANSISTOR FABRICATION METHOD

[75] Inventors: Deok-Ho Cho; Soo-Min Lee; Tae-Hyeon Han; Byung-Ryul Ryum; Kwang-Eui Pyun, all of Daejeon, Rep. of Korea

[73] Assignees: Electronics and Telecommunications Research Institute, Daejeon; Korea Telecommunication Authority, Seoul, both of Rep. of Korea

[21] Appl. No.: 700,930

[22] Filed: Aug. 23, 1996

[30] Foreign Application Priority Data

Dec. 20, 1995 [KR] Rep. of Korea ............ 95-52691

[51] Int. Cl.[6] ........................... H01L 21/265
[52] U.S. Cl. ........................... 438/320
[58] Field of Search ............. 437/31, 126, 131, 437/132; 148/DIG. 72

[56] References Cited

U.S. PATENT DOCUMENTS

| | | | |
|---|---|---|---|
| 5,250,448 | 10/1993 | Hamasaki et al. | 437/31 |
| 5,399,511 | 3/1995 | Taka et al. | 437/31 |
| 5,484,737 | 1/1996 | Ryum et al. | 437/31 |
| 5,496,745 | 3/1996 | Ryum et al. | 437/31 |
| 5,523,243 | 6/1996 | Mohammad | 437/31 |

OTHER PUBLICATIONS

Sato et al., "A 'Self-Aligned' Selective MBE Technology For High-Performance Bipolar Transistors", IEEE 1990, pp.25.7.1–25.7.4.

Ugajin et al., "SiGe Drift Base Bipolar Technology Using Si–GeH$_4$ MBE for Sub–40 GHz $f_{MAX}$ Operation", IEEE 1992, pp. 26–29.

Ugajin et al., "SiGe Drift Base Bipolar Transistor with Self–Aligned Selective CVD–Tungsten Electrodes", IEEE Mar. 1994.

*Primary Examiner*—Tuan H. Nguyen
*Attorney, Agent, or Firm*—Nixon & Vanderhye P.C.

[57] ABSTRACT

A silicon/silicon-germanium bipolar transistor fabrication method employs a metallic silicide film as an extrinsic base electrode to reduce resistance of the extrinsic base electrode, and to increase a maximum oscillation frequency and cut-off frequency due to its self-aligned structure. The fabrication method enables agglomeration to occur on the side wall of the polycrystalline silicon film connected to the metallic silicide film instead of on the interface between the metallic silicide film and the lower silicon/silicon-germanium film, and leads the extrinsic base electrode to be sandwitched by the insulator films, thereby realizing a constant resistance and also resulting in the application of integrated circuits to a mass production mechanism.

23 Claims, 4 Drawing Sheets

SILICON-SILICON-GERMANIUM HETEROJUNCTION BIPOLAR TRANSISTOR FABRICATION METHOD

BACKGROUND OF THE INVENTION

1. Field of the Invention

The present invention relates generally to a bipolar transistor, and more particularly to a silicon/silicon-germanium heterojunction bipolar transistor fabrication method capable of reducing resistance of the extrinsic base electrode and increasing a maximum oscillation frequency and cut-off frequency due to its self-aligned structure, using a metallic silicide film as an extrinsic base electrode.

2. Description of the Prior Art

In the fabrication of a conventional heterojunction bipolar transistor, a non-self-align and a self-align technology are adopted.

As for a self-align technology, with reference to an article published in IEDM by a company named NEC in 1990, FIG. 1 shows a schematic cross-sectional view of a SSSB(Super Self-aligned Selectively grown Base) transistor using silicon/silicon—germanium as a base film. The fabrication of the SSSB transistor will be set forth as follows, referring to FIG. 1.

First, an oxide film 4, a P+ polycrystalline silicon 5 and an insulator film 6 are sequentially deposited on an N+ epitaxial layer 3. Thereafter, the insulator film 6 and the P+ polycrystalline silicon film 5 are sequentially etched using an emitter mask.

An etch-back technique is applied to form a side wall insulator spacer 7 on each side wall of layers having the P+ polycrystalline silicon film 5 and the insulator film 6, and then an oxide film 4 is laterally etched to a certain extent using a wet-etching technique.

A silicon/silicon-germanium film 8 serving as a base film is formed in the etched space using a selective epitaxial layer growth method and an additional side wall insulator spacer 9 is provided on each of the side wall insulator spacers 7 using an etch-back technique. N+ polycrystalline silicon 10 serving as an emitter is selectively grown on the exposed silicon/silicon-germanium film, thereby completing the SSSB transistor fabrication using silicon/silicon-germanium film as a base film.

However, the fabrication method of the above-described conventional silicon/silicon-germanium bipolar transistor has a disadvantage, in that since a wet-etching technique is applied to the oxide film 4, it is difficult to control etch-stop line thereto, whereby parasitic capacitance between the base and the collector cannot be precisely controlled. Also, the above method has an additional disadvantage, in that, to grow the silicon/silicon-germanium film 8 as a base film, a thickness has to be precisely adjusted. Further, because the P+ polycrystalline silicon 5 is employed as the extrinsic base electrode, resistance is much more increased than when using metallic silicide.

Specifically, when a non-self-aligned silicon/silicon-germanium geterojunction bipolar trasistor is formed by using a polycrystalline silicon as an extrinsic base electrode in accordance with the conventional method, a pattern formation can be easily achieved, so that the device performance becomes uniform, yet, resistance of an extrinsic base electrode increases, parasitic capacitances become large and even when a metallic silicide is employed as an extrinsic base electrode, an interface between a metallic silicide film and a silicon/silicon-germanium can lead to surface agglomeration occurring due to heat treatment, thereby making its application to an integrated circuit inappropriate.

SUMMARY OF THE INVENTION

It is, therefore, an object of the present invention to provide a self-aligned silicon/silicon-germanium heterojunction bipolar transistor fabrication method for reducing extrinsic-base resistance and increasing a maximum oscillation frequency and cut-off frequency.

To achieve the above-described object, the silicon/silicon-germanium bipolar transistor fabrication method in accordance with the present invention includes a first step for growing a silicon/silicon-germanium film to a predetermined thickness on a semiconductor substrate wherein a first, second and third conductive layers are sequentially formed and a device isolator is achieved, a second step for forming a first insulator film, a metallic silicide film and a second insulation film sequentially on the grown silicon/silicon-germanium film, a third step for etching the second insulator film, the metallic silicide film and the first insulation film consecutively using a mask so as to connect the metallic silicide film serving as a base electrode and the silicon/silicon-germanium film, and forming a fourth conductive layer, a fourth step for insulating an emitter-base region in accordance with forming an oxide film by selectively oxidizing the exposed fourth conductive layer and the side wall polycrystalline silicon spacers, after removing the second insulator film and the metallic silicide film provided on the emitter region and forming side wall multi-crystalline silicon spacers, a fifth step for forming a fifth conductive layer after etching the first insulator film exposed on the emitter, and a sixth step for depositing an insulator film, forming contacts and performing metallic wiring process.

DETAILED DESCRIPTION OF PREFERRED EMBODIMENTS

With reference to the accompanying drawings, an NPN silicon/silicon-germanium bipolar transistor fabrication method will be described in detail hereunder. FIGS. 2A through 2I show a sequential fabrication method of the silicon/silicon-germanium bipolar transistor in accordance with the present invention.

Figure 1:
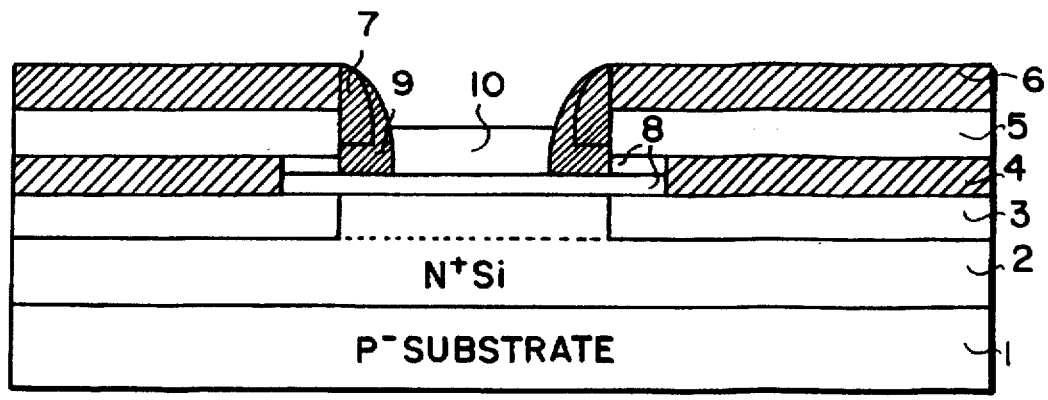
FIG. 1 is a cross-sectional view of a bipolar transistor in accordance with a conventional art.
Figure 2A:
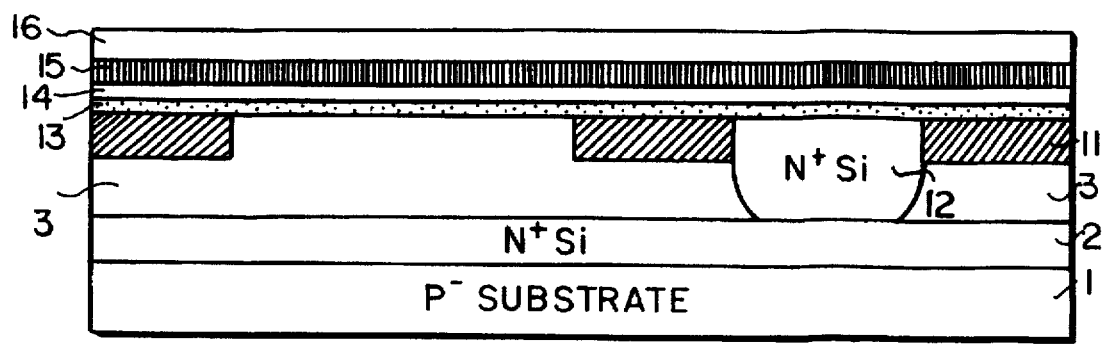
FIGS. 2A through 2I are process views of a silicon/silicon-germanium bipolar transistor in accordance with the present invention.

As shown in FIG. 2A, an N+ implanted layer 2 is formed on a P− silicon substrate 1, on which an N− epitaxial layer 3 is provided. An insulator film 11 is formed on the N− epitaxial layer 3 and N+ sinker 12 is formed from surface of the insulator film 11 down to the surface of the N+ implanted layer 2 so as to from a collector electrode.

After realizing the device isolation and forming the N+ implanted layer 2 and the N+ sinker 12, a silicon/silicon-germanium film 13 serving as a base film applied to the silicon/silicon-germanium bipolar transistor is grown thereon to a predetermined thickness thereof adopting an epitaxial layer growth technique such as molecular beam epitaxy (MBE) or chemical vapor deposition (CVD).

Thereafter, a nitride film 14 is deposited on the silicon/silicon-germanium film 13 to a thickness of 100 nm using a chemical vapor deposition technique. A metallic silicide 15 is formed on the nitride film 14 to a thickness of 100 nm using a sputtering method and another 200 nm-thick nitride film 16 is provided on the metallic silicide 15 using the CVD method.

In the above fabrication process, the nitride film 16 provided on the metallic silicide 15 prevents the metallic silicide 15 from etching by diluted HF during wafer washing, and also the lower-deposited nitride film 14 prevents agglomeration which can occur on the interface between the metallic silicide 15 and the silicon/silicon-germanium film 13 by means of heat treatment needed for a device fabrication. As a result, the nitride films 14, 16 maintain the uniform thickness of the metallic silicide 15, whereby the resistance of the extrinsic base electrode remains constant.

Figure 2B:
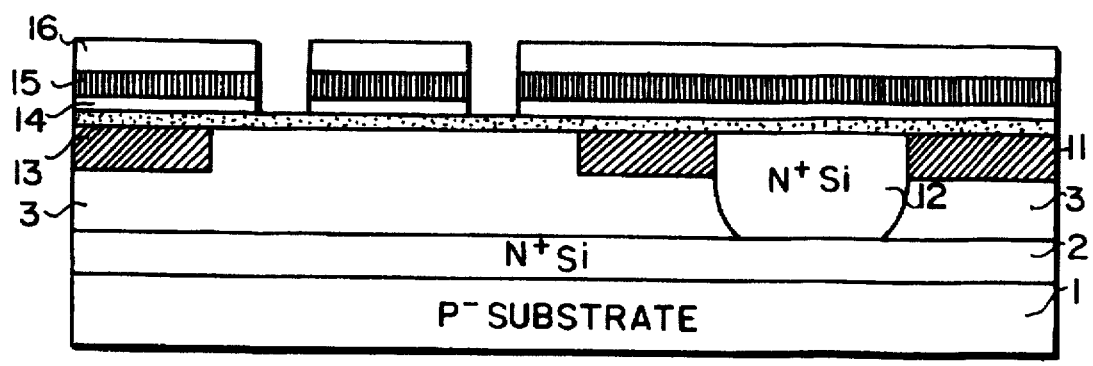
Figure 2C:
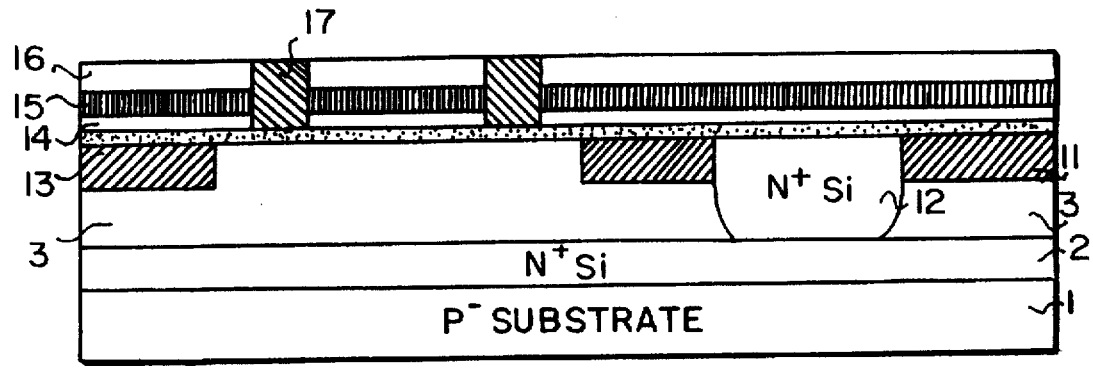

As shown in FIGS. 2B and 2C, the predetermined portions of the nitride film 16, the metallic silicide 15 and the nitride fill 17 are sequentially etched by applying thereto a masking process and impurities are in-situ Boron-doped polycrystalline silicon is refilled thereon, thus forming a P+ polycrystalline silicon base linker 17 using an etch-back method. Meanwhile, the width of the trench pattern for forming the P+ multi-crystalline silicon can be narrowed employing electron beam.

For instance, when the width of the trench pattern is 0.2 μm, the thickness of the polycrystalline silicon deposited thereon for forming the P+ polycrystalline silicon base linker 17 has to be more than 0.1 μm. Also, there are provided boron nitride (BN) sourcing and in-situ Boron doping method for forming the P+ polycrystalline silicon base linker 17.

Figure 2D:
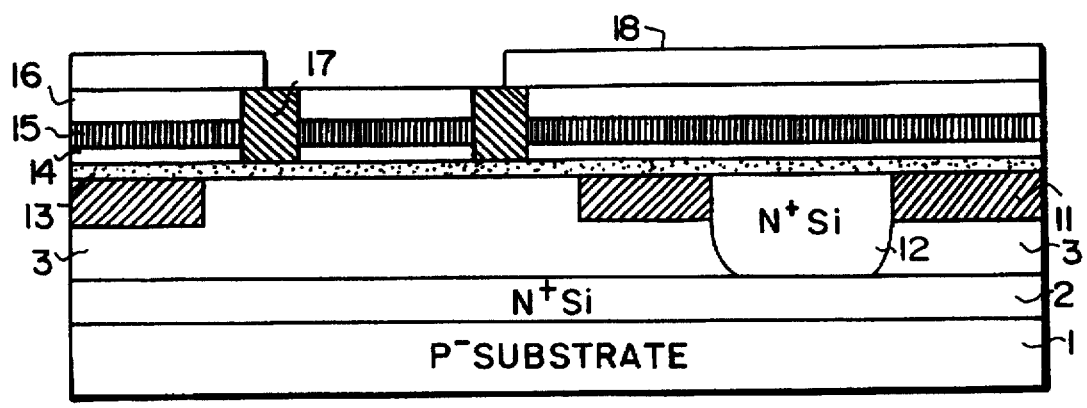
Figure 2E:
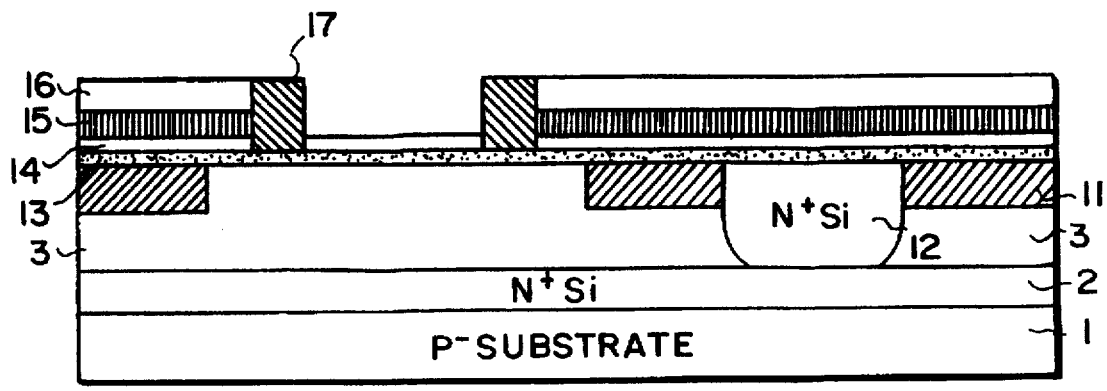

As shown in FIGS. 2D and 2E, using the photo resist film 18 as a mask, the nitride film 16 is selectively removed by dry-etching and then the exposed metallic silicide film 15 is eliminated by HF solution in accordance with a selective wet-etching method. At this time, because the photo resist film 18 which is used to perform a selective removal of the nitride film 16 has only to be formed within the surface of the P+ polycrystalline silicon base linkers 17, the align margin of the photolithography can reach to the width of the P+ polycrystalline base linkers 17, thereby facilitating a selective removal of the nitride film 16.

Figure 2F:
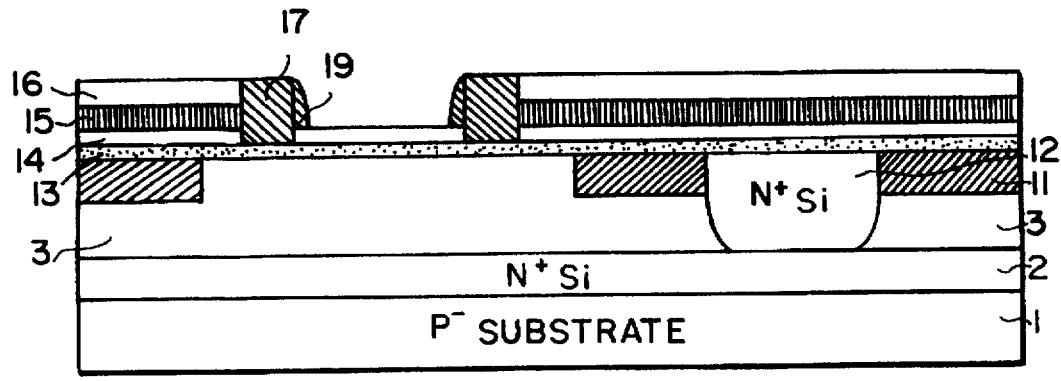

Referring to FIG. 2F, after depositing a polycrystalline silicon which is approximately 50 nm in thickness, side wall polycrystalline silicon spacers 19 are formed on each side wall of the silicon base linkers 17 by an etch-back technique. The reason why the side wall polycrystalline silicon spacers 19 has to be provided in the above process will be illustrated in FIG. 2G.

Figure 2G:
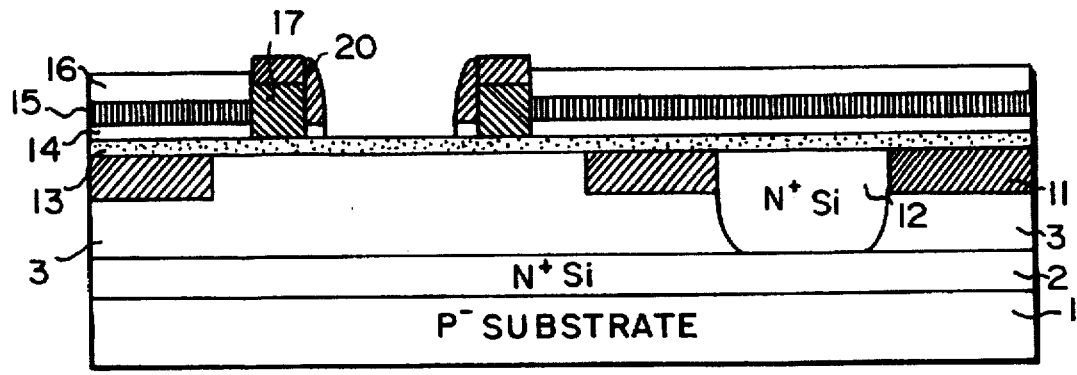

As shown in FIGS. 2F and 2G, using a HIPOX (HIgh Pressure OXidation) as a means of low temperature oxidation technique, the exposed polycrystalline silicon 17 and side wall polycrystalline silicon spacers 19 are selectively oxidized to form an oxide film 20, thereby realizing insulation between emitter and base and then the nitride film 14 is removed by dry-etching.

Meanwhile, when the lower nitride film 14 is processed by a dry-etching method, the upper nitride film 16 also becomes dry-etched, so that the thickness of the nitride 14 must be thinner than that of the upper nitride film 16. At this time, the thickness of the lower nitride film 14, as shown in FIG. 2F, is determined in accordance with an etching selectivity ratio of the polycrystalline silicon 17 to the nitride film 14 during the formation of the side wall polycrystalline silicon 19 by dry-etching.

The HIPOX (HIgh Pressure OXidation) technique which enables oxidation at a low temperature (about 700° C.) so as to selectively oxidize the polycrystalline silicon 17 and the side wall polycrystalline silicon spacers 19 is adopted in the above process to restrain the strain relaxation in the silicon/silicon-germanium film 13 at high temperature processes.

The side wall polycrystalline silicon spacers 19 as shown in FIG. 2F is provided to prevent deformation in the oxide profile, such as a sharp corner-oxide which can occur when oxidizing the polycrystalline silicon 17 without the side wall polycrystalline silicon spacers 19.

Figure 2H:
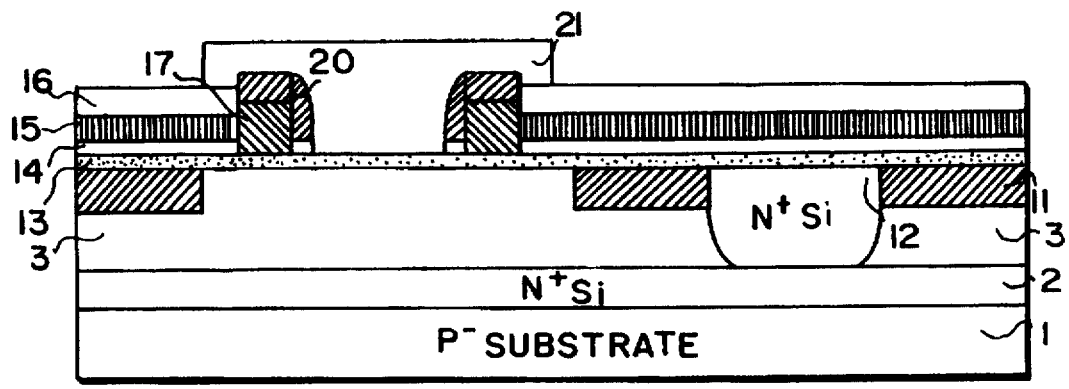

Subsequently, as shown in FIG. 2H, a polycrystalline silicon film 21 serving as an emitter electrode is deposited so as to form an emitter electrode.

As a technique to dope the polycrystalline silicon 21, there are provided an As ion-implanting method, an in-situ P doping method.

Figure 2I:
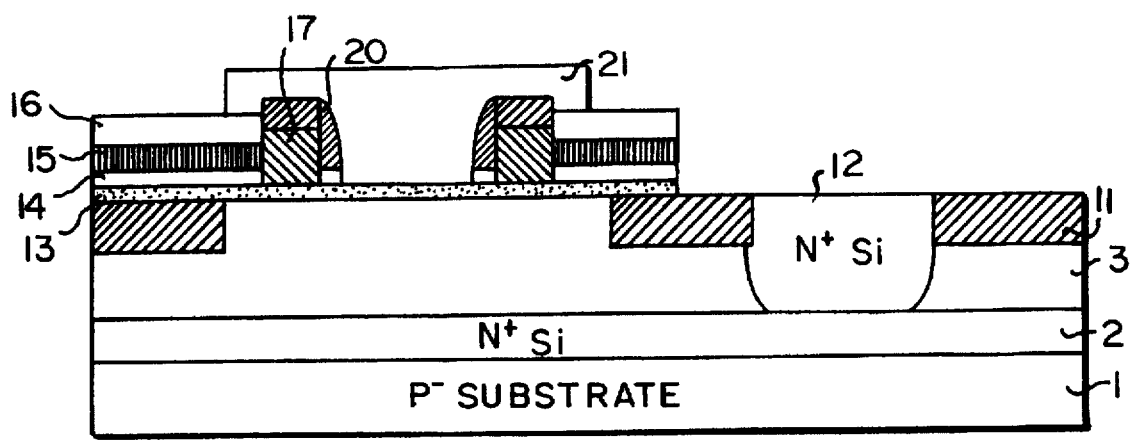

Thereafter, as shown in FIG. 2I, the upper nitride film 16, the metallic silicide film 15 and the lower nitride film 14 and the silicon/silicon-germanium 13 on the N$^+$ sinker 12 are sequentially etched by a dry-etching method, thereby forming a collector electrode.

Finally, an insulation film is deposited on the etched surface and after contact-hole forming process, metallic wiring process is followed in accordance with a publicized technique, thereby completing the silicon/silicon-germanium bipolar transistor fabrication.

As described above, the silicon/silicon-germanium bipolar transistor fabrication method in accordance with the present invention employs a metallic silicide film as an extrinsic base electrode, thereby capable of reducing resistance of the extrinsic base electrode, and increasing a maximum oscillation frequency and cut-off frequency due to its self-aligned structure.

Additionally, because the metallic silicide film is connected to each side wall of the polycrystalline silicon base linkers, agglomeration caused by heat treatment occurs on the side wall of the polycrystalline silicon film connected to the metallic silicide film instead of on the interface between the metallic silicide film and the lower silicon/silicon-germanium film, and the extrinsic base electrode becomes sandwiched by the insulator films, thereby leading to a constant resistance and resulting in the application of integrated circuits to a mass production mechanism.

What is claimed is:

1. A silicon/silicon-germanium bipolar transistor fabrication method, comprising:

growing a silicon/silicon-germanium film on a semiconductor substrate wherein a first, second and third conductive layers are sequentially formed and a device isolation is achieved;

forming a first insulator film, a metallic silicide film and a second insulator film sequentially on said grown silicon/silicon-germanium film;

etching said second insulator film, said metallic silicide film and said first insulator film consecutively using a mask, and forming a fourth conductive layer so as to connect said metallic silicide film serving as a base electrode to said silicon/silicon-germanium film;

removing said second insulator film and said metallic silicide film provided on the emitter region and forming side wall polycrystalline silicon spacers;

insulating and emitter-base layer in accordance with forming an oxide film by selectively oxidizing said exposed fourth conductive layer and said side wall polycrystalline silicon spacers;

forming a fifth conductive layer after etching said first insulator film exposed on said emitter; and, depositing an insulation film, forming a contact hole and performing metallic wiring process.

2. The silicon/silicon-germanium bipolar transistor fabrication method of claim 1, wherein said semiconductor substrate is formed of one selected from a P– silicon substrate and a N– silicon substrate.

3. The silicon/silicon-germanium bipolar transistor fabrication method of claim 1, wherein said first conductive layer is formed of one selected from an N+ silicon layer and a P+ silicon layer.

4. The silicon/silicon-germanium bipolar transistor fabrication method of claim 1, wherein said second conductive layer is formed of one selected from an N+ sinker and a P+ sinker.

5. The silicon/silicon-germanium bipolar transistor fabrication method of claim 1, wherein said third conductive layer is formed of one selected from an N– epitaxial layer and a P– epitaxial layer.

6. The silicon/silicon-germanium bipolar transistor fabrication method of claim 1, wherein said fourth conductive layer is formed of one selected from an N+ base linker and a P+ base linker.

7. The silicon/silicon-germanium bipolar transistor fabrication method of claim 6, wherein said fourth conductive layer is ion-implanted by impurities such as B and BF2, er P and As, or said fourth conductive layer is doped by one selected from in-situ B and P.

8. The silicon/silicon-germanium bipolar transistor fabrication method of claim 1, wherein said fifth conductive layer is formed of one selected from an N+ polycrystalline silicon and a P+ polycrystalline silicon.

9. The silicon/silicon-germanium bipolar transistor fabrication method of claim 8, wherein said fifth conductive layer is ion-implanted by impurities such as B and BF2, or P and As, or said fifth conductive layer is doped by one selected from in-situ B and P.

10. The silicon/silicon-germanium bipolar transistor fabrication method of claim 1, wherein said first insulator film and said second insulator film are each a nitride film.

11. The silicon/silicon-germanium bipolar transistor fabrication method of claim 10, wherein the thickness of said first insulation film ranges from 30 nm to 200 nm.

12. The silicon/silicon-germanium bipolar transistor fabrication method of claim 10, wherein the thickness of said second insulation film ranges from 100 nm to 200 nm.

13. The silicon/silicon-germanium bipolar transistor fabrication method of claim 1, wherein the impurity concentration of said first conductive layer ranges from $10^{19}$ to $10^{21}$ $cm^{-3}$.

14. The silicon/silicon-germanium bipolar transistor fabrication method of claim 1, wherein the impurity concentration of said second conductive layer ranges from $10^{19}$ to $10^{21}$ $cm^{-3}$.

15. The silicon/silicon-germanium bipolar transistor fabrication method of claim 1, wherein the impurity concentration of said third conductive layer ranges from $10^{16}$ to $10^{18}$ $cm^{-3}$.

16. The silicon/silicon-germanium bipolar transistor fabrication method of claim 1, wherein the impurity concentration of said fourth conductive layer ranges from $10^{19}$ to $10^{21}$ $cm^{-3}$.

17. The silicon/silicon-germanium bipolar transistor fabrication method of claim 1, wherein the impurity concentration of said fifth conductive layer ranges from $10^{19}$ to $10^{21}$ $cm^{-3}$.

18. The silicon/silicon-germanium bipolar transistor fabrication method of claim 1, wherein said metallic silicide film is formed of one selected from or a desired combination of TiSix, TiW, TiN, PtSix and WSix.

19. The silicon/silicon-germanium bipolar transistor fabrication method of claim 18, wherein "X" ranges from zero to 2.6.

20. The silicon/silicon-germanium bipolar transistor fabrication method of claim 18, wherein the thickness of said metallic silicide film ranges from 50 nm to 300 nm.

21. The silicon/silicon-germanium bipolar transistor fabrication method of claim 1, wherein said oxide film is formed using a HIPOX (HIgh Pressure OXidation) technique.

22. The silicon/silicon-germanium bipolar transistor fabrication method of claim 1, wherein said metallic silicide film is sandwiched by a nitride film so as to restrain the reaction between the metallic silicide film and the silicon/silicon-germanium film.

23. The silicon/silicon-germanium bipolar transistor fabrication method of claim 1, wherein said fourth conductive layer is applied to electrically connect said metallic silicide film serving as an extrinsic base electrode and a silicon/silicon-germanium film serving as an active base film.

* * * * *